(12) United States Patent
Chen et al.

(10) Patent No.: US 9,796,578 B2
(45) Date of Patent: Oct. 24, 2017

(54) MICROELECTROMECHANICAL SYSTEMS DEVICES WITH IMPROVED RELIABILITY

(71) Applicant: Apple Inc., Cupertino, CA (US)

(72) Inventors: Kuan-Lin Chen, Sunnyvale, CA (US); Richard Yeh, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/502,835

(22) Filed: Sep. 30, 2014

(65) Prior Publication Data

US 2016/0159638 A1    Jun. 9, 2016

Related U.S. Application Data

(60) Provisional application No. 61/950,712, filed on Mar. 10, 2014.

(51) Int. Cl.
  *B81B 3/00*    (2006.01)
(52) U.S. Cl.
  CPC .................. *B81B 3/0086* (2013.01)
(58) Field of Classification Search
  None
  See application file for complete search history.

(56) References Cited

U.S. PATENT DOCUMENTS

| | | | |
|---|---|---|---|
| 7,786,820 B2 * | 8/2010 | Hunt | H01G 7/06 333/161 |
| 8,129,802 B2 | 3/2012 | Fukuda et al. | |
| 8,471,643 B2 | 6/2013 | Kim et al. | |
| 8,810,023 B2 | 8/2014 | Koduri | |
| 8,811,636 B2 | 8/2014 | Stephanou et al. | |
| 2003/0119221 A1 * | 6/2003 | Cunningham | B81B 3/0024 438/52 |
| 2008/0138922 A1 * | 6/2008 | Wan | B81C 1/00095 438/52 |
| 2010/0237738 A1 * | 9/2010 | Smith | G11C 23/00 310/309 |
| 2010/0315757 A1 * | 12/2010 | Yamazaki | H01G 5/16 361/290 |
| 2011/0067495 A1 * | 3/2011 | Yu | G01P 15/0888 73/514.24 |

(Continued)

FOREIGN PATENT DOCUMENTS

EP    2520918    7/2012

*Primary Examiner* — Reema Patel
*Assistant Examiner* — Steven Christopher
(74) *Attorney, Agent, or Firm* — Treyz Law Group, P.C.; Kendall W. Abbasi; Zachary D. Hadd (57) ABSTRACT

An electronic device may include components that are formed using microelectromechanical systems (MEMS) technology. A MEMS device may include a MEMS structure bonded to a semiconductor substrate. The MEMS structure may be formed from a silicon substrate having a cavity and a moveable member suspended over the cavity and free to oscillate within the cavity. The semiconductor substrate may be a complementary metal-oxide semiconductor substrate having circuitry such as sensing electrodes. The sensing electrodes may be used to gather signals that are produced by movement of the suspended member. One or more of the electrodes on the semiconductor substrate may be covered by a dielectric film to prevent electrical shorts between adjacent electrodes on the semiconductor substrate.

16 Claims, 8 Drawing Sheets

(56) References Cited

U.S. PATENT DOCUMENTS

2012/0025331 A1* 2/2012 Anderson .......... B81C 1/00182
257/415
2016/0240320 A1* 8/2016 Renault .................... H01G 5/16

* cited by examiner

MICROELECTROMECHANICAL SYSTEMS DEVICES WITH IMPROVED RELIABILITY

This application claims the benefit of provisional patent application No. 61/950,712 filed Mar. 10, 2014, which is hereby incorporated by reference herein in its entirety.

BACKGROUND

This relates generally to electronic devices and, more particularly, to electronic devices that include microelectromechanical systems (MEMS) devices.

Electronic devices often include MEMS devices. MEMS devices may, for example, be used to form accelerometers, gyroscopes, microphones, and other types of sensors. MEMS devices are sometimes formed by bonding a MEMS structure having a suspended moveable member to a complementary metal-oxide-semiconductor (CMOS) substrate having circuitry for sensing movement of the suspended MEMS structure. For example, the semiconductor substrate may include capacitive sensing electrodes that are configured to gather signals produced by movement of the suspended MEMS structure.

The suspended microstructures in a MEMS device are typically formed using a deep reactive ion etch (DRIE). In many cases, the deep etch process used to form trenches around a suspended MEMS structure will leave behind undesirable surface features such as scalloped sidewalls. The presence of scalloped sidewalls and rough surfaces in a MEMS device can make the device more susceptible to fractures and chipping. If care is not taken, the particles released from impact-induced fractures in the silicon can cause electrical shorts between metal contact pads on the semiconductor substrate.

It would therefore be desirable to be able to provide electronic devices with improved MEMS devices.

SUMMARY

An electronic device may include components that are formed using microelectromechanical systems (MEMS) technology. For example, an electronic device may include one or more sensors such as an accelerometer and/or gyroscope that are formed by a MEMS device.

A MEMS device may include a MEMS structure bonded to a semiconductor substrate. The MEMS structure may be formed from a silicon substrate having a cavity and a moveable member suspended over the cavity. The moveable member may be integral with the silicon substrate but may be substantially isolated from the silicon substrate by trenches. A thin beam of silicon may couple the moveable member to the peripheral silicon and may allow the suspended member to oscillate within the cavity.

The semiconductor substrate in a MEMS device may be a complementary metal-oxide semiconductor substrate having circuitry such as sensing electrodes. The sensing electrodes may be used to gather signals that are produced by movement of the suspended member.

One or more of the electrodes on the semiconductor substrate may be covered by a dielectric film to prevent electrical shorts between adjacent electrodes on the semiconductor substrate. The dielectric film may be etched during two separate etching steps. In the first etching step, raised protrusions may be formed in the dielectric film. The raised protrusions may provide strength to the bonding region where the MEMS structure is bonded to the semiconductor substrate. After the second etching step, some of the metal on the semiconductor substrate may be exposed, while one or more electrodes on the semiconductor substrate may remain covered by the dielectric film. If desired, the dielectric film may cover capacitive sensing electrodes on the semiconductor substrate without affecting the sensing ability of the capacitive sensing electrodes.

Further features of the invention, its nature and various advantages will be more apparent from the accompanying drawings and the following detailed description of the preferred embodiments.

DETAILED DESCRIPTION

Figure 1:
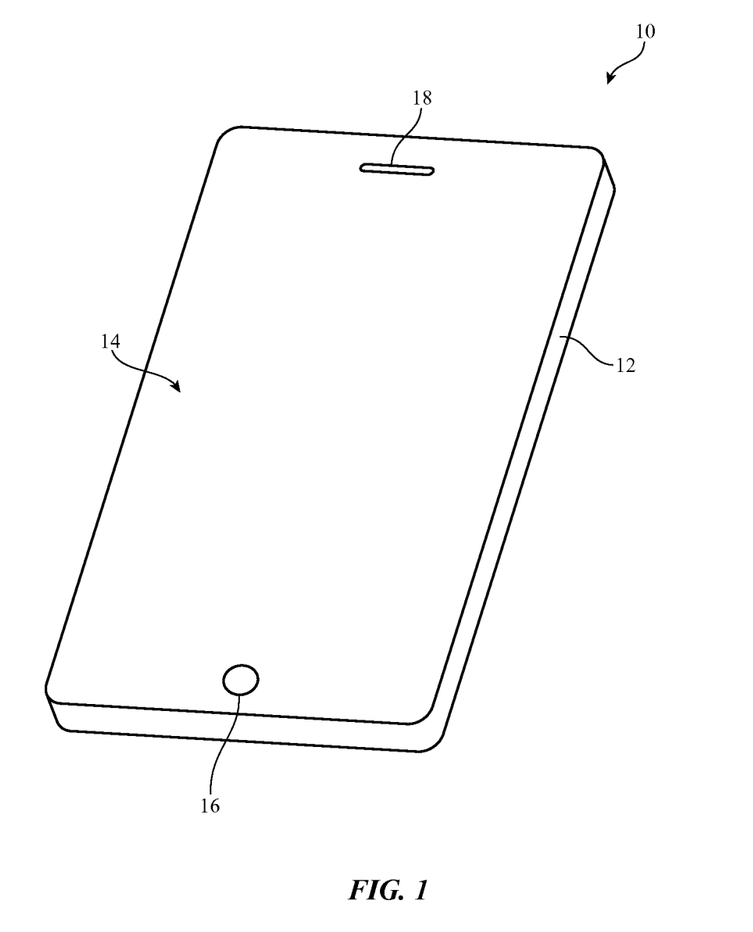
FIG. 1 is a perspective view of an illustrative electronic device of the type that may be provided with a MEMS device in accordance with an embodiment of the present invention.

An illustrative electronic device that may be provided with one or more MEMS devices is shown in FIG. 1. Electronic devices such as device 10 of FIG. 1 may be cellular telephones, media players, other handheld portable devices, somewhat smaller portable devices such as wristwatch devices, pendant devices, or other wearable or miniature devices, gaming equipment, tablet computers, notebook computers, desktop computers, televisions, computer monitors, computers integrated into computer displays, or other electronic equipment.

In the example of FIG. 1, device 10 includes a display such as display 14. Display 14 has been mounted in a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of display pixels formed from liquid crystal display (LCD) components, an array of electrophoretic display pixels, an array of plasma display pixels, an array of organic light-emitting diode display pixels, an array of electrowetting display pixels, or display pixels based on other display technologies. The brightness of display 14 may be adjustable. For example, display 14 may include a backlight unit formed from a light source such as a lamp or light-emitting diodes that can be used to increase or decrease display backlight levels and thereby adjust display brightness. Display 14 may also include organic light-emitting diode pixels or other pixels with adjustable intensities. In this type of display, display brightness can be adjusted by adjusting the intensities of drive signals used to control individual display pixels.

Display 14 may be protected using a display cover layer such as a layer of transparent glass or clear plastic. Openings may be formed in the display cover layer. For example, an opening may be formed in the display cover layer to accommodate a button such as button 16. An opening may also be formed in the display cover layer to accommodate ports such as speaker port 18.

In the center of display 14, display 14 may contain an array of active display pixels. This region is sometimes referred to as the active area of the display. A rectangular ring-shaped region surrounding the periphery of the active display region may not contain any active display pixels and may therefore sometimes be referred to as the inactive area of the display. The display cover layer or other display layers in display 14 may be provided with an opaque masking layer in the inactive region to hide internal components from view by a user.

Figure 2:
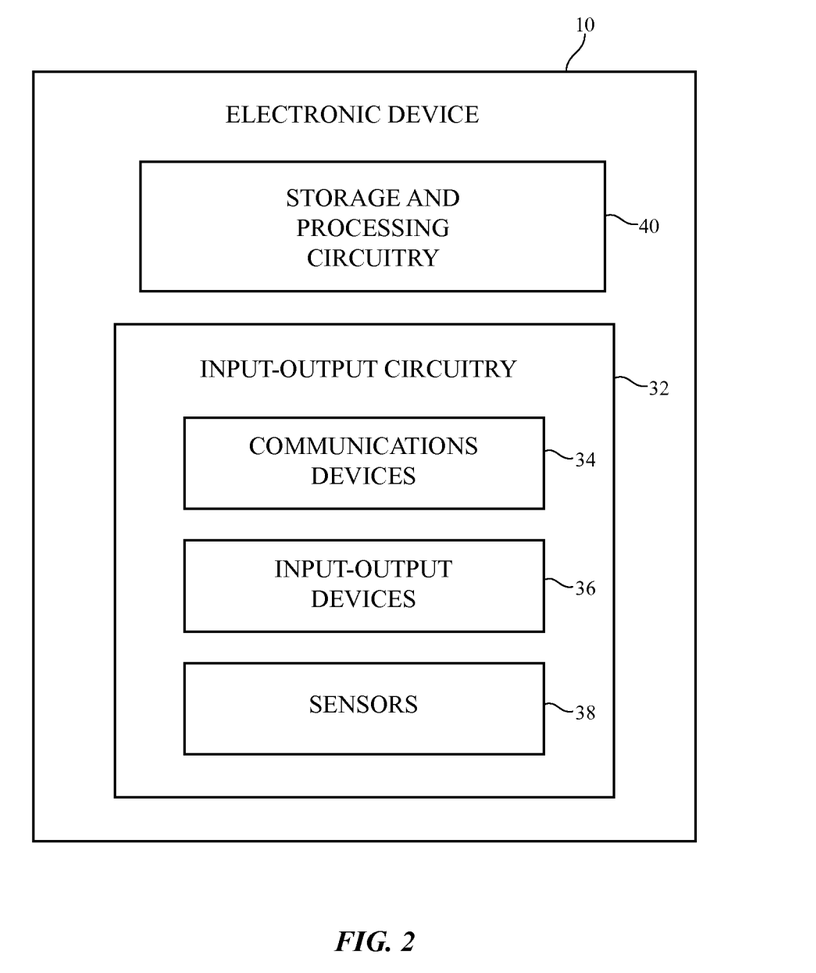
FIG. 2 is a schematic view of an illustrative electronic device of the type that may be provided with a MEMS device in accordance with an embodiment of the present invention.

A schematic diagram of device 10 is shown in FIG. 2. As shown in FIG. 2, electronic device 10 may include control circuitry such as storage and processing circuitry 40. Storage and processing circuitry 40 may include one or more different types of storage such as hard disk drive storage, nonvolatile memory (e.g., flash memory or other electrically-programmable-read-only memory), volatile memory (e.g., static or dynamic random-access-memory), etc.

Processing circuitry in storage and processing circuitry 40 may be used in controlling the operation of device 10. The processing circuitry may be based on a processor such as a microprocessor and other suitable integrated circuits. With one suitable arrangement, storage and processing circuitry 40 may be used to run software on device 10 such as internet browsing applications, email applications, media playback applications, operating system functions, software for capturing and processing images, software implementing functions associated with gathering and processing sensor data, software that makes adjustments to display brightness and touch sensor functionality, etc.

Input-output circuitry 32 may be used to allow input to be supplied to device 10 from a user or external devices and to allow output to be provided from device 10 to the user or external devices.

Input-output circuitry 32 may include wired and wireless communications circuitry 34. Communications circuitry 34 may include radio-frequency (RF) transceiver circuitry formed from one or more integrated circuits, power amplifier circuitry, low-noise input amplifiers, passive RF components, one or more antennas, and other circuitry for handling RF wireless signals. Wireless signals can also be sent using light (e.g., using infrared communications).

Input-output circuitry 32 may include input-output devices 36 such as button 16 of FIG. 1, joysticks, click wheels, scrolling wheels, a touch screen such as display 14 of FIG. 1, other touch sensors such as track pads or touch-sensor-based buttons, vibrators, audio components such as microphones and speakers, image capture devices such as a camera module having an image sensor and a corresponding lens system, keyboards, status-indicator lights, tone generators, key pads, and other equipment for gathering input from a user or other external source and/or generating output for a user.

Sensor circuitry such as sensors 38 of FIG. 2 may include an ambient light sensor for gathering information on ambient light levels, proximity sensor components (e.g., light-based proximity sensors and/or proximity sensors based on other structures), accelerometers, gyroscopes, magnetic sensors, and other sensor structures. Sensors 38 of FIG. 2 may, for example, include one or more MEMS sensors (e.g., accelerometers, gyroscopes, microphones, force sensors, pressure sensors, capacitive sensors, or any other suitable type of sensor formed using a MEMS device). If desired, other suitable components in device 10 may be formed using MEMS technology.

Figure 3:
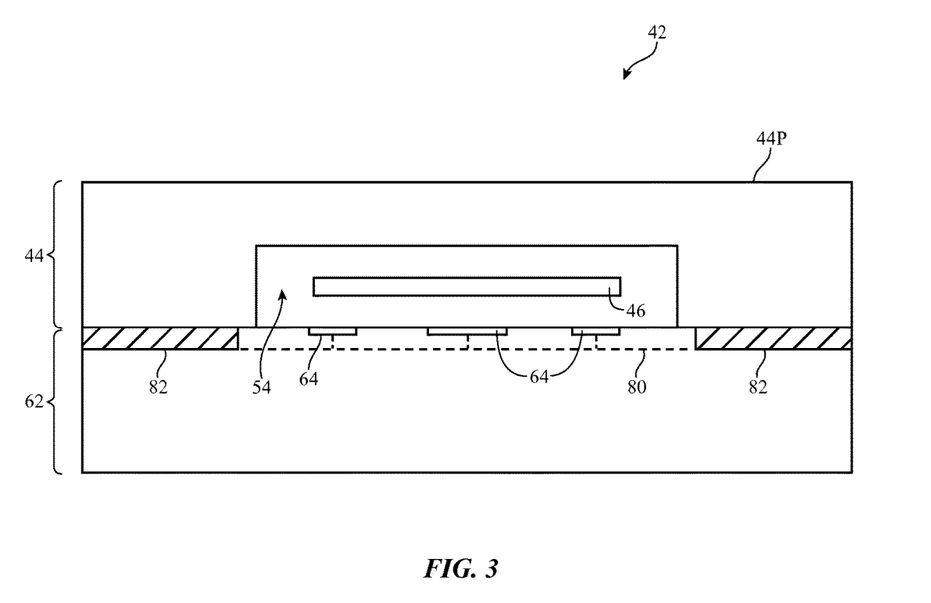
FIG. 3 is a cross-sectional side view of an illustrative MEMS device having a MEMS structure bonded to a semiconductor substrate in accordance with an embodiment of the present invention.

A cross-sectional side view of an illustrative MEMS device that may be used in an electronic device such as electronic device 10 of FIGS. 1 and 2 is shown in FIG. 3. As shown in FIG. 3, MEMS device 42 may include a MEMS structure such as MEMS structure 44 bonded to a semiconductor substrate such as semiconductor substrate 62.

MEMS structure 44 may, for example, be formed from silicon and may include a moveable member such as moveable member 46 suspended over a cavity such as cavity 54. Member 46 may be integral with MEMS structure 44 but may be substantially isolated from the surrounding portions of structure 44 so that member 46 is free to move or vibrate within cavity 54.

Semiconductor substrate 62 may include circuitry such as circuitry 82, conductive pads 64 (e.g., electrodes), and traces 80. Conductive pads 64 may be used as capacitive sensing electrodes that gather signals produced by movement of suspended member 46. Signals such as gathered sensor signals may be conveyed between electrodes 64 and circuitry 82 via conductive traces 80. Circuitry 82 may, for example, include inductors, capacitors, resistors, switches, amplifiers, and/or other circuitry. Semiconductor substrate 62 may be formed using CMOS technology, NMOS technology, PMOS technology, or other suitable semiconductor technology. Arrangements in which semiconductor substrate 62 is formed using a CMOS die are sometimes described herein as an example.

Figure 4:
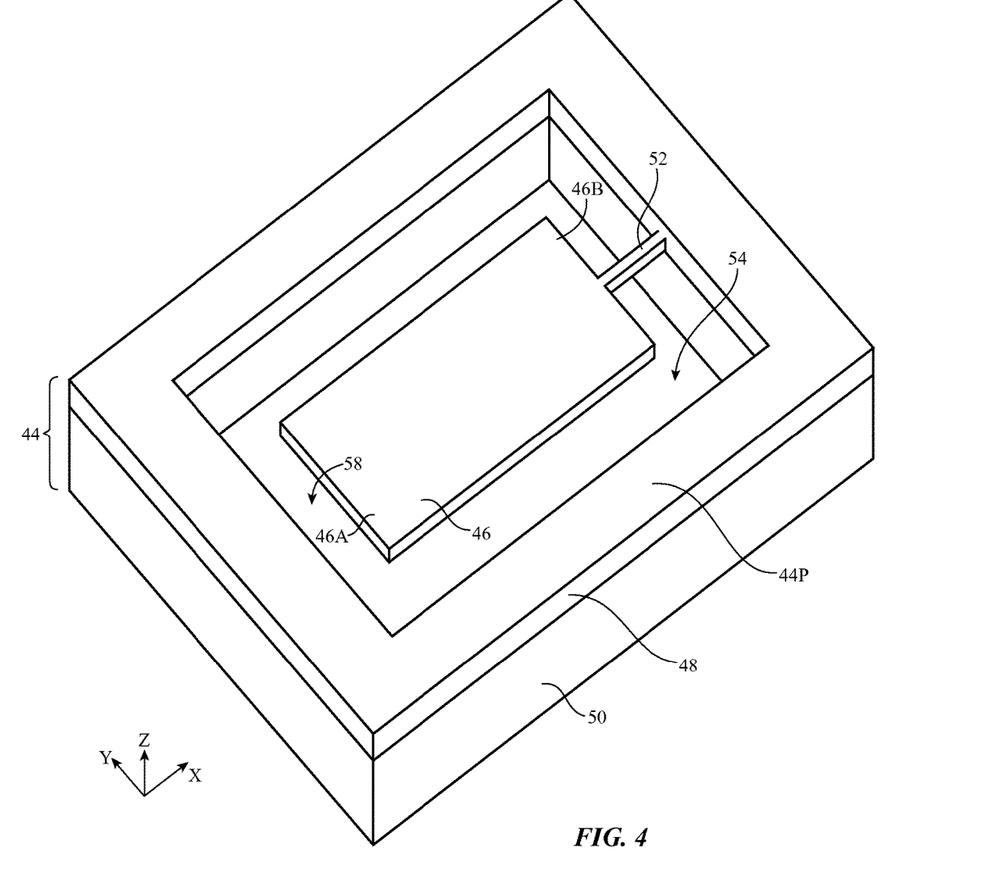
FIG. 4 is a perspective view of an illustrative MEMS structure in accordance with an embodiment of the present invention.

A perspective view of a an illustrative MEMS structure that may be used in a MEMS device of the type shown in FIG. 3 is shown in FIG. 4. As shown in FIG. 4, MEMS structure 44 may be formed from a silicon substrate and may include a cavity such as cavity 54 over which a moveable member such as moveable MEMS member 46 is suspended. Trenches such as trenches 58 may partially surround member 46 and may separate member 46 from the surrounding silicon bulk (e.g., peripheral portions 44P of MEMS structure 44). For example, trenches 58 may surround suspended member 46 on one, two, three, or all four sides of member 46.

Suspended member 46 (sometimes referred to as a suspended membrane or a diving board) may be coupled to peripheral portions 44P of structure 44 by a bridge structure such as bridge structure 52. Bridge structure 52 may, for example, be formed form a narrow beam of silicon that bridges the trench between suspended structure 46 and peripheral portions 44P of structure 44. Bridge structure 52 (sometimes referred to as a beam member or spring member), may be used to anchor suspended structure 46 to peripheral portions 44P while allowing movement of suspended member 46 within cavity 54 (e.g., end portion 46A of member 46 may be free to move in the x, y, and/or z directions as indicated in FIG. 4).

The fixed-free arrangement of FIG. 4 in which suspended member 46 is anchored on one end (e.g., end 46B) while the opposing end (e.g., end 46A) is free to move is merely illustrative. If desired, a fixed-fixed arrangement may be used in which opposing ends of suspended MEMS member 46 are anchored to peripheral portions 44P of structure 44 using first and second beams 52. In general, member 46 may be suspended using any suitable number of beams 52 (e.g., one, two, three, or more than three beams). Suspended members of the type shown in FIG. 4 are sometimes referred to as diving boards. This is, however, merely illustrative. If desired, other types of micromechanical structures may be used.

If desired, MEMS structure 44 may include first and second substrates (e.g., first and second silicon substrates) such as first substrate 50 and second substrate 48. First substrate 50 may sometimes be referred to as a silicon cap structure. Second substrate 48, from which one or more suspended MEMS structures 46 are formed, may sometimes be referred to as a MEMS layer. Cavity 54 may be formed by etching a recess into first substrate 50, and trenches 58 may be formed by etching openings into second substrate 48. First substrate 50 and second substrate 48 may be bonded together to form MEMS structure 44.

Figure 5:
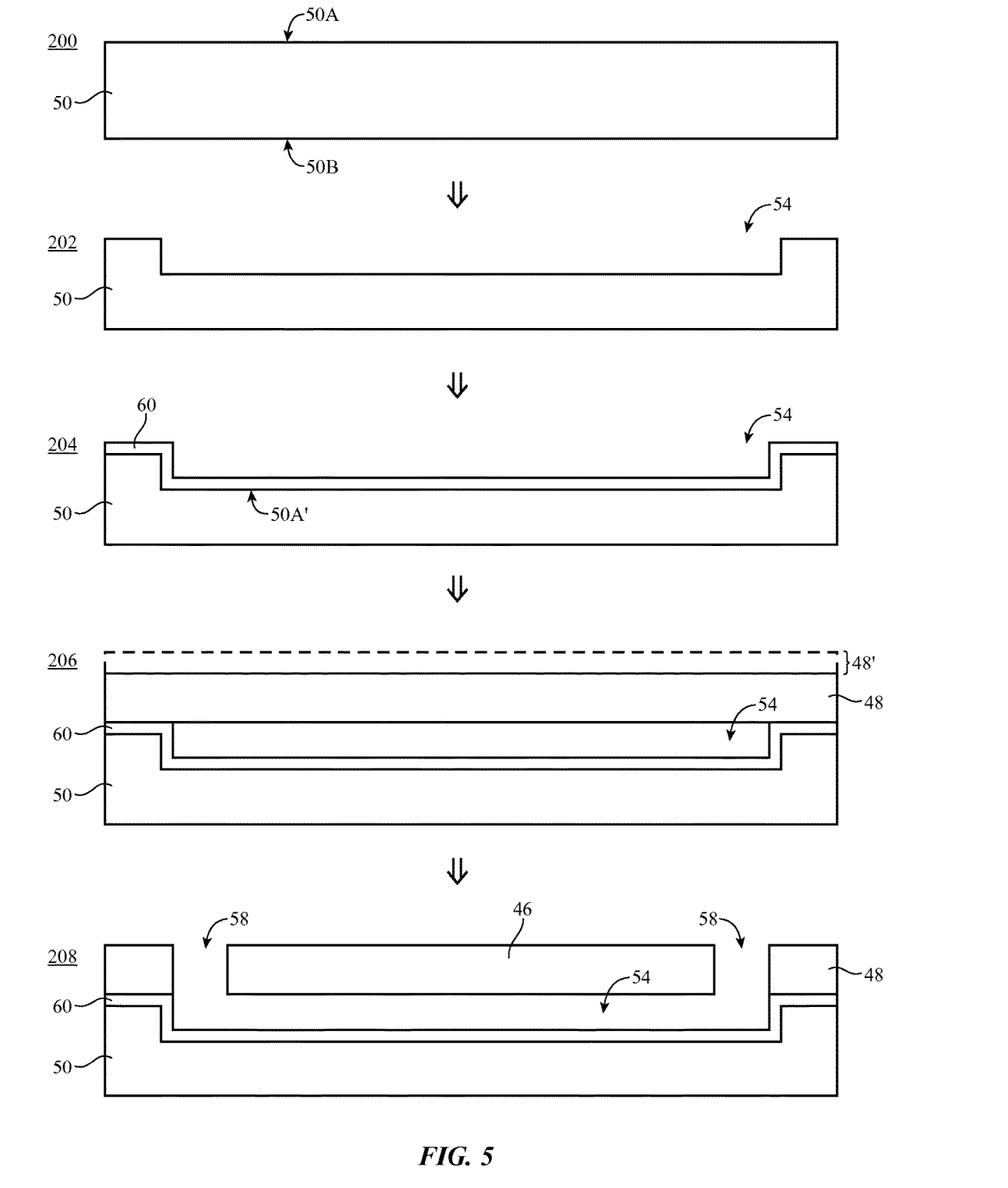
FIG. 5 is a diagram showing illustrative steps involved in forming a MEMS structure in accordance with an embodiment of the present invention.

FIG. 5 is a diagram of illustrative steps involved in forming a MEMS structure such as MEMS structure 44 of FIG. 4. At step 200, a first substrate such as silicon substrate 50 having opposing planar surfaces 50A and 50B may be provided.

At step 202, etching equipment may be used to etch a recess or cavity such as cavity 54 in surface 50A of substrate 50. Any suitable etching process may be used to etch cavity 54 (e.g., plasma etching such as deep reactive ion etching, wet etching, dry etching, etc.).

At step 204, upper surface 50A' of substrate 50 may be oxidized to form a thin surface layer of oxide (e.g., silicon dioxide) such as oxide layer 60 on upper surface 50A'.

At step 206, a second substrate such as silicon substrate 48 may be bonded to substrate 50. Oxide layer 60 may be interposed between first substrate 50 and second substrate 48. If desired, step 206 may include thinning substrate 48 to remove a portion of substrate 48 (e.g., portion 48') and thereby reduce the thickness of substrate 48 as desired.

At step 208, etching equipment may be used to etch trenches 58 in substrate 48 and to thereby form suspended MEMS member 46. Trenches 58 may surround or partially surround MEMS member 46. Any suitable etching process may be used to etch trenches 58 (e.g., plasma etching such as deep reactive ion etching, wet etching, dry etching, etc.).

Figure 6:
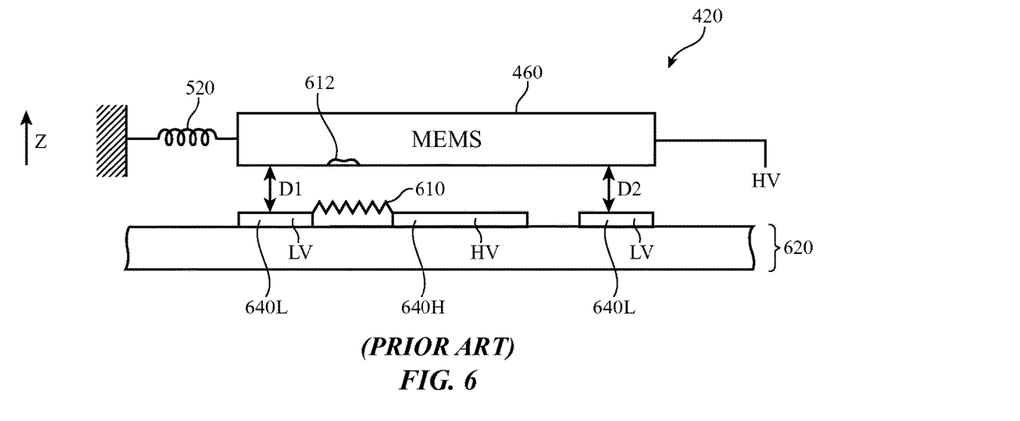
FIG. 6 is a diagram showing a conventional MEMS device.

The deep etch process used to form trenches 58 in substrate 48 may sometimes lead to scalloped or roughened surfaces on substrate 48 that can in turn lead to fractures or chips in the silicon. If care is not taken, particles that result from stress-induced cracks in the silicon can cause electrical shorts in MEMS devices. FIG. 6 is a diagram showing how fractures in a MEMS structure can result in electrical shorts in a conventional MEMS device.

As shown in FIG. 6, conventional MEMS device 420 includes member 460 suspended over CMOS substrate 620. Member 460 is anchored via spring member 520 but is allowed to move in the z-direction. CMOS substrate 620 includes a high voltage (HV) metal pad 640H interposed between low voltage (LV) metal pads 640H. LV pads 640L are used to read out capacitance changes as member 460 moves and the distances D1 and D2 between member 460 and LV pads 640 change. HV pad 640H is not typically used for signal sensing and may be used as a ground contact.

As shown in FIG. 6, metal pads 640H and 640L are exposed. The exposure of metal pads such as HV metal pad 640H can lead to electrical shorts 610 between LV metal pad 640L and HV metal pad 640H. For example, in a drop event, fractures in the silicon (e.g., fracture 612 in member 460) can result in the release of particles that in turn cause electrical shorts 610 between LV pad 640L and HV pad 640H. Electrical shorts of this type can lead to inaccurate sensor readings or may otherwise decrease the reliability of the MEMS device.

Figure 7:
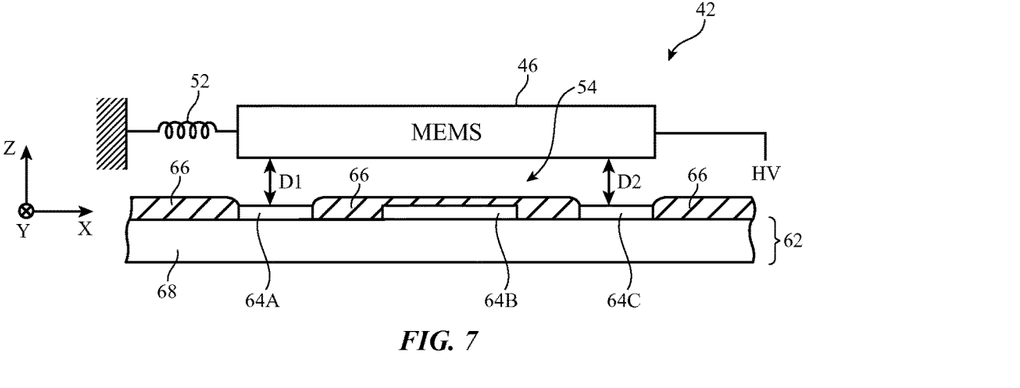
FIG. 7 is a diagram showing a MEMS device in which an electrode on a semiconductor substrate is covered by a dielectric layer in accordance with an embodiment of the present invention.

Electrical shorts in a MEMS device may be prevented by providing a layer of dielectric over some or all of the metal pads on the semiconductor substrate of a MEMS device. An illustrative arrangement in which metal pads of a semiconductor substrate in a MEMS device are covered with dielectric material is shown in FIG. 7. As shown in FIG. 7, MEMS device 42 may include a moveable MEMS structure such as moveable member 46 suspended over a semiconductor substrate such as semiconductor substrate 62. Member 46 may be anchored at one or more locations by a spring member such as spring member 52 (e.g., a thin beam of silicon that couples suspended member 46 to the peripheral portions of the MEMS structure). Member 46 may be suspended over a cavity such as cavity 54 and may therefore be allowed to move or oscillate within cavity 54 (e.g., in the x, y, and/or z directions as indicated in FIG. 7). Semiconductor substrate 62 may include circuitry such as electrode 64A, electrode 64B, and electrode 64C (sometimes referred to as conductive pads). Electrodes 64A, 64B, and 64C may be formed from a metal such as silver, nickel, zinc, aluminum, or copper (as examples) or may be formed from a conductive material such as indium tin oxide or other conductive material. Electrodes 64A, 64B, and 64C may, for example, be located directly under suspended member 46.

Some of the electrodes on semiconductor substrate 62 may be signal-sensing electrodes (sometimes referred to as sensing electrodes, capacitive sensing electrodes, or signal electrodes), while others may be non-signal-sensing electrodes. For example, electrodes such as electrode 64A and electrode 64C may be signal sensing electrodes that are configured to gather signals produced by oscillations of suspended member 46. Conductive electrode 64A may be configured to detect capacitance changes as distance D1 between electrode 64A and member 46 changes, while electrode 64C may be configured to detect capacitance changes as distance D2 between electrode 64C and member 46 changes. If desired, signal-sensing electrodes such as electrodes 64A and 64C may be low voltage electrodes (as an example).

Some electrodes such as electrode 64B may be non-signal-sensing electrodes (sometimes referred to as non-sensing electrodes, ground voltage electrodes, fixed voltage electrodes, or reference voltage electrodes) that are not used for gathering signals. Non-signal-sensing electrodes such as electrode 64B may, for example, be used as reference voltage electrodes, ground voltage electrodes, high voltage electrodes, fixed voltage electrodes, etc. If desired, non-signal-sensing electrode 64B may be interposed between signal-sensing electrodes 64A and 64C and may be used to provide shielding between signal-sensing electrodes 64A and 64C. This is, however, merely illustrative. If desired, other arrangements of signal-sensing electrodes and non-signal-sensing electrodes may be used. For example, electrode 64B may be a signal-sensing electrode and electrodes 64A and 64C may be non-signal-sensing electrodes. If desired, all three of electrodes 64A, 64B, and 64C may be signal-sensing electrodes.

The arrangement of FIG. 7 in which electrode 64B is larger than electrodes 64A and 64C is merely illustrative. In general, electrodes 64A, 64B, and 64C may have any suitable size. Similarly, the example in which signal-sensing electrodes 64A and 64C are low voltage electrodes and non-signal-sensing electrode 64B is a high voltage electrode is merely illustrative. If desired, electrodes 64A and 64C may be high voltage electrodes and electrode 64B may be a low voltage electrode. There may be one, two, three, four, or more than four electrodes on semiconductor substrate 62. Arrangements in which semiconductor substrate 62 includes three electrodes and in which electrodes 64A and 64C are signal-sensing electrodes while electrode 64B is a non-signal-signal sensing electrode are sometimes described herein as an example.

To minimize electrical shorts between adjacent electrodes on semiconductor substrate 62, semiconductor substrate 62 may include a thin layer of dielectric over one or more of electrodes 64A, 64B, and 64C. For example, as shown in FIG. 7, a dielectric material such as dielectric material 66 may be formed over electrodes on semiconductor substrate 62 such as non-signal sensing electrode 64B. Dielectric material 66 (sometimes referred to as a dielectric thin film, a dielectric layer, a passivation layer, or a protection layer), may be formed from silicon nitride, silicon oxinitride, silicon oxide, or any other suitable dielectric material that may be used to passivate the surface of semiconductor substrate 62.

In the example of FIG. 7, some of the electrodes on semiconductor substrate 62 are exposed (e.g., are not covered by dielectric material 66), while other electrodes on semiconductor substrate 62 are insulated by dielectric material 66. For example, non-signal-sensing electrode 64B may be covered by dielectric material 66, while signal-sensing electrodes 64A and 64C may be exposed. Because dielectric material 66 insulates electrode 64B from electrode 64A, particles that are released from silicon member 46 in a drop event will not cause an electrical short between electrode 64A and electrode 64B. Similarly, the dielectric material between electrode 64B and electrode 64C may prevent electrical shorts between electrode 64B and electrode 64C.

If desired, suspended member 46 may be held at the same potential as insulated electrode 64B in order to minimize charge build-up in dielectric layer 66 above electrode 64B. For example, in arrangements where electrode 64B is a high voltage electrode, suspended member 46 may also be held at a high voltage (HV) as shown in FIG. 7. This is, however, merely illustrative. If desired, MEMS structure 46 may be held at a different voltage than electrode 64B.

Figure 8:
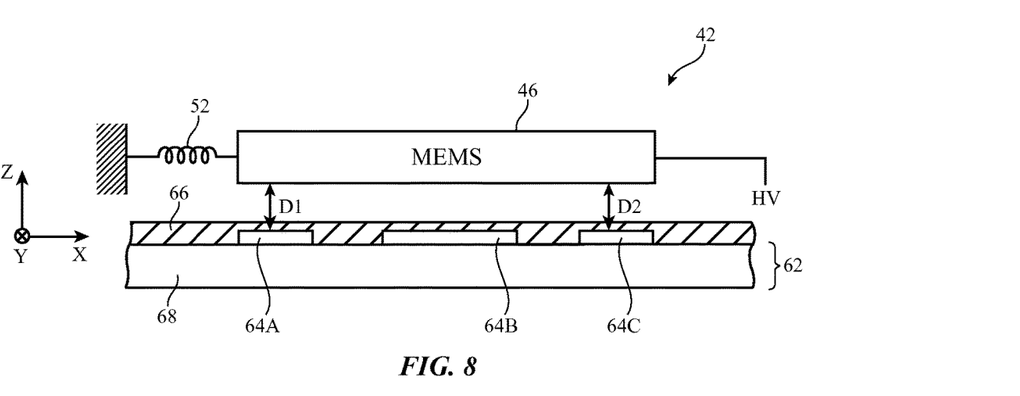
FIG. 8 is a diagram showing a MEMS device in which electrodes including a sensing electrode are covered by a dielectric layer in accordance with an embodiment of the present invention.

If desired, dielectric layer 66 may cover both sensing electrodes and non-sensing electrodes on semiconductor substrate 62. FIG. 8 is a diagram showing how dielectric layer 66 may cover electrode 64A, electrode 64B, and electrode 64C on semiconductor substrate 62. Even though signal-sensing electrodes 64A and 64C are covered by dielectric thin film 66, signal-sensing electrode 64A may still be configured to detect capacitance changes as the distance D1 between electrode 64A and suspended member 46 changes, and signal-sensing electrode 64C may still be configured to detect capacitance changes as the distance D2 between electrode 64C and suspended member 46 changes.

Figure 9:
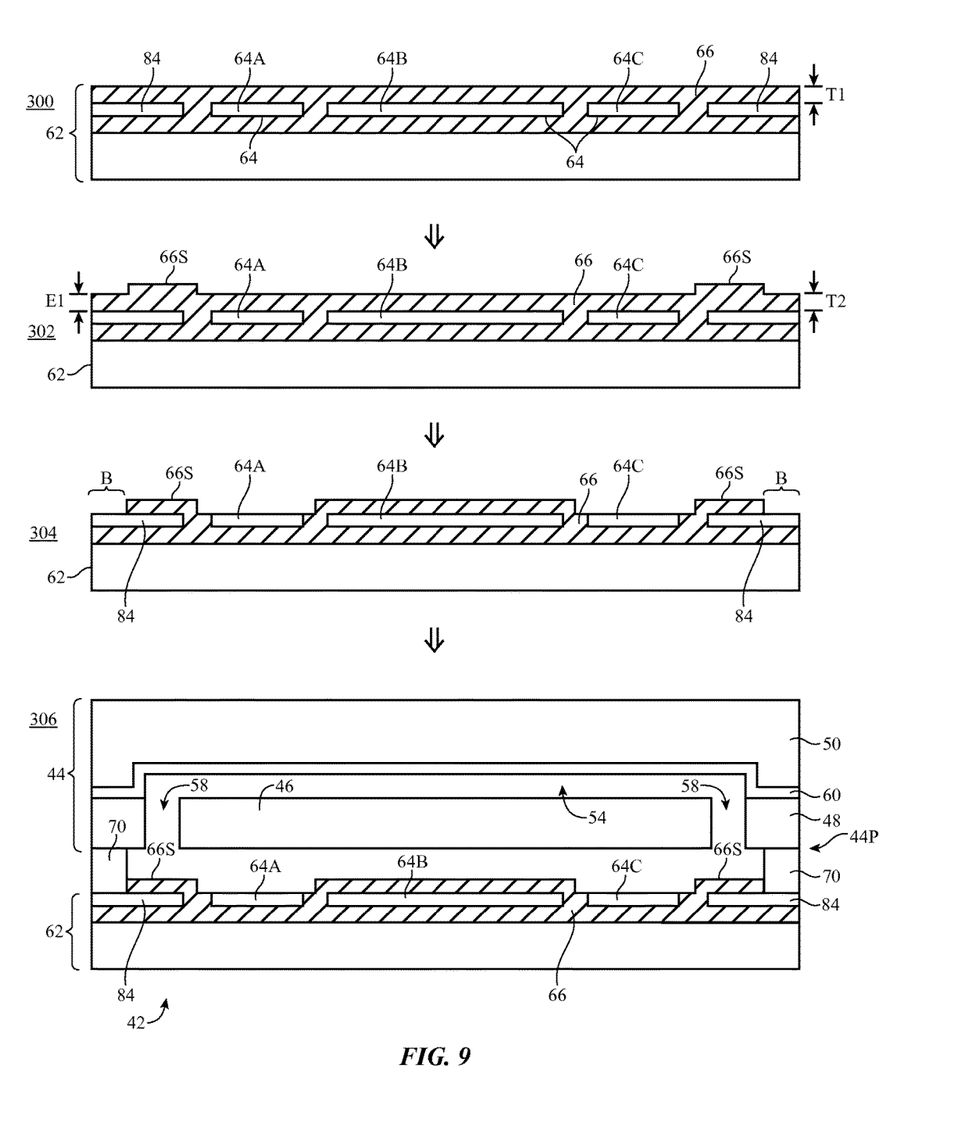
FIG. 9 is a diagram showing illustrative steps involved in forming a MEMS device having a MEMS structure bonded to a semiconductor substrate on which electrodes are covered by a dielectric layer in accordance with an embodiment of the present invention.

FIG. 9 is a diagram of illustrative steps involved in forming a MEMS device (e.g., a CMOS-MEMS device of the type shown in FIGS. 3, 4, 5, 7, and 8).

At step 300, semiconductor substrate 62 may be provided having circuitry such as electrodes 64 and conductive pads 84. Conductive pads 84 may be used in electrically connecting substrate 62 to MEMS structure 44. A passivation layer such as passivation layer 66 may cover electrodes 64 and conductive pads 84. Semiconductor substrate 62 may be fabricated using a sequence of material deposition steps, doping steps, lithography steps, and etching steps. At step 300, passivation layer 66 may have a thickness T1 over electrodes 64.

At step 302, a first etching step may be performed using a first mask. During the first etching step, the thickness of passivation layer 66 over electrodes 64A, 64B, and 64C may be reduced from thickness T1 to thickness T2. The etch depth E1 associated with the first etching step 302 may be controlled such that a thin layer of dielectric material 66 remains on all of electrodes 64 and conductive pads 84. Etch depth may be controlled using a timed etch or using an etch stop (e.g., a dopant etch stop, an electrochemical etch stop, etc.). The etching process of step 302 may be used to form raised protrusions in dielectric material 66 such as raised protrusions 66S. Raised protrusions 66S may be used to strengthen the bond region where substrate 62 is bonded to MEMS structure 44.

At step 304, a second etching step may be performed using a second mask. During the second etching step, dielectric material 66 over one or more of electrodes 64 may be removed. For example, as shown in FIG. 9, electrodes 64A and 64C may be exposed after the second etching step is performed. Conductive electrode 64B, on the other hand, maintains a thin film of dielectric 66 over its surface in order to provide insulation between electrode 64B and adjacent electrodes 64A and 64C. Outer conductive pads 84 may also be exposed during step 304. The exposed portions B of outer conductive pads 84 may be used as bonding regions where substrate 62 is bonded to MEMS structure 44.

The example of FIG. 9 in which signal-sensing electrodes 64A and 64C are exposed during the second etch step 304 (e.g., to form a semiconductor substrate of the type shown in FIG. 7) is merely illustrative. If desired, a thin film of dielectric material 66 may remain on electrodes 64A and 64C after the second etch step 304 (e.g., to form a semiconductor substrate of the type shown in FIG. 8). With this type of arrangement, the second etch step 304 may include removing dielectric material 66 in bonding regions B of outer conductive pads 84 to expose portions B of pads 84.

At step 306, semiconductor substrate 62 may be bonded to a corresponding MEMS structure such as MEMS structure 44 to form MEMS device 42. As shown in FIG. 9, a bonding member such as bonding member 70 may be used to bond MEMS structure 44 to semiconductor substrate 62. Bonding member 70 may, for example, be an aluminum-germanium eutectic bond that forms a hermetic seal around the MEMS structure while also forming an electrical connection between MEMS structure 44 and semiconductor substrate 62. As shown in FIG. 9, bonding member 70 is interposed between peripheral portion 44P of MEMS structure 44 and conductive pads 84 of semiconductor substrate 62. If desired, other bonding techniques may be used to mechanically and electrically bond semiconductor substrate 62 to MEMS structure 44 (e.g., surface bonding, metallic layer bonding, conductive adhesive bonding, etc.). The use of a eutectic bond is merely illustrative.

As shown in FIG. 9, some of the electrodes on semiconductor substrate 62 are exposed (e.g., are not covered by dielectric material 66), while other electrodes on semiconductor substrate 62 are insulated by dielectric material 66. For example, non-signal-sensing electrode 64B may be covered by dielectric material 66, while signal-sensing electrodes 64A and 64C may be exposed. Because dielectric material 66 insulates electrode 64B from electrode 64A, particles that are released from silicon MEMS member 46 in a drop event will not cause an electrical short between electrode 64A and electrode 64B. Similarly, the dielectric material between electrode 64B and electrode 64C may prevent electrical shorts between electrode 64B and electrode 64C.

If desired, a thin layer of dielectric material 66 may cover signal-sensing electrodes 64A and 64C in MEMS device 42 (e.g., as shown in FIG. 8). Signal-sensing electrodes 64A and 64C may still be used to gather signals that are produced by movement of suspended member 46 even when covered by a thin layer of dielectric material 66.

Figure 10:
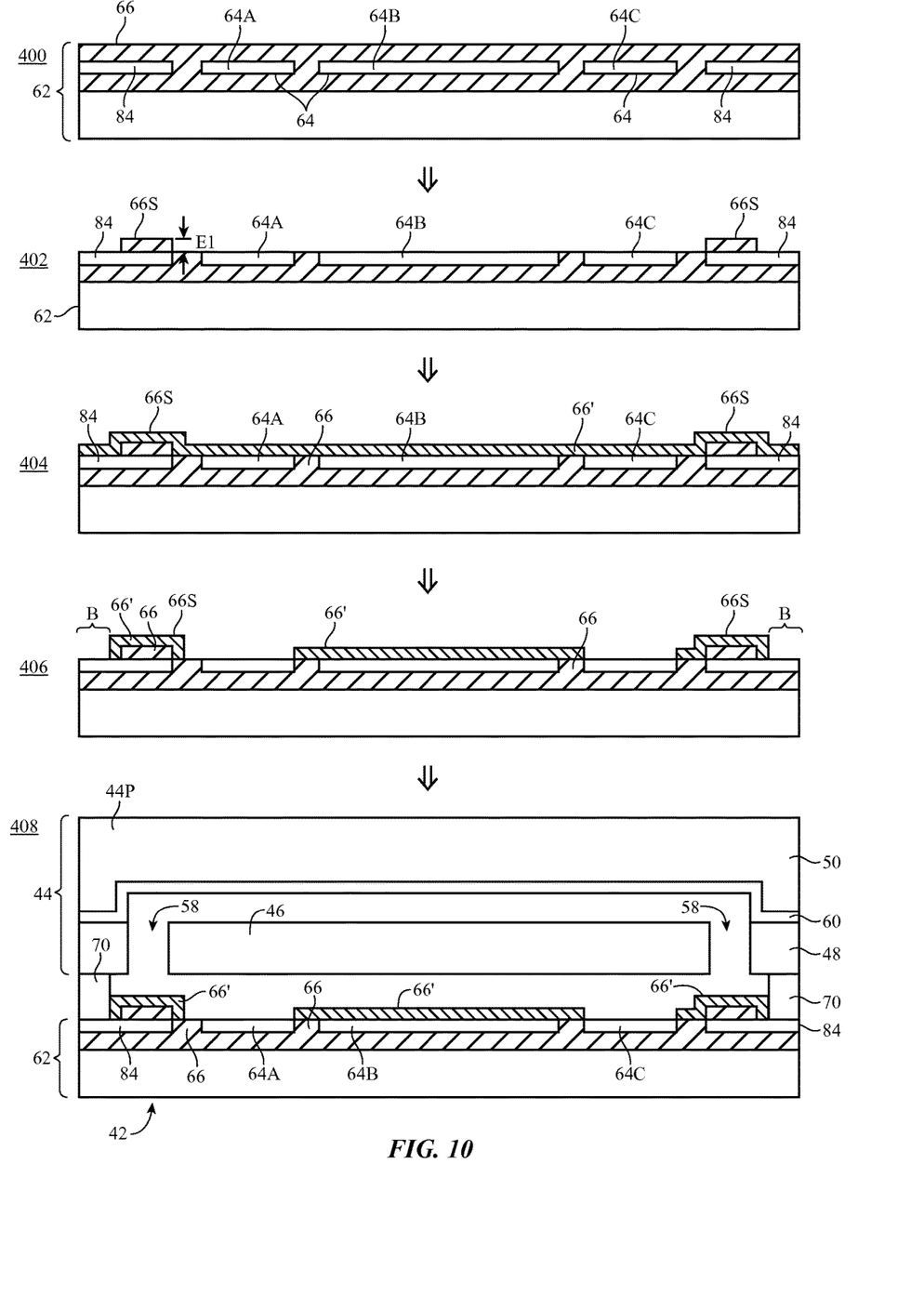
FIG. 10 is a diagram showing illustrative steps involved in forming a MEMS device having a MEMS structure bonded to a semiconductor substrate on which electrodes are covered by a dielectric layer in accordance with an embodiment of the present invention.

FIG. 10 is a diagram of illustrative steps involved in forming a MEMS device (e.g., a CMOS-MEMS device of the type shown in FIGS. 3, 4, 5, 7, and 8) according to another suitable method. Similar to the method of FIG. 9, the method of FIG. 10 includes first and second etching steps. In the arrangement of FIG. 10, however, a dielectric deposition step takes place between the first and second etching steps.

At step 400, semiconductor substrate 62 may be provided having circuitry such as electrodes 64 and conductive pads 84. Conductive pads 84 may be used in electrically connecting substrate 62 to MEMS structure 44. A passivation layer such as passivation layer 66 may cover electrodes 64 and conductive pads 84. Semiconductor substrate 62 may be fabricated using a sequence of material deposition steps, doping steps, lithography steps, and etching steps.

At step 402, a first etching step may be performed using a first mask. During the first etching step, portions of passivation layer 66 over electrodes 64A, 64B, and 64C may be removed to expose electrodes 64A, 64B, and 64C. Portions of passivation layer 66 over pads 84 may also be removed. The etch depth E1 associated with the first etching step 402 may be controlled such that the etch stops at the interface between passivation layer 66 and metal electrodes 64. Etch depth may be controlled using a timed etch or using an etch stop (e.g., a dopant etch stop, an electrochemical etch stop, etc.). The etching process of step 402 may be used to form raised protrusions in dielectric material 66 such as raised protrusions 66S. Raised protrusions 66S may be used to strengthen the bond region where substrate 62 is bonded to MEMS structure 44.

At step 404, a second passivation layer such as passivation layer 66' may be deposited over the surface of substrate 62. Passivation layer 66' may be formed form the same dielectric material as layer 66 or may be formed from a different dielectric material. As shown in FIG. 10, passivation layer 66' covers the surfaces of electrodes 64A, 64B, and 64C and the surfaces of pads 84.

At step 406, a second etching step may be performed using a second mask. During the second etching step, dielectric material 66' over one or more of electrodes 64 may be removed. For example, as shown in FIG. 10, electrodes 64A and 64C may be exposed after the second etching step is performed. Conductive electrode 64B, on the other hand, maintains a thin film of dielectric 66' over its surface in order to provide insulation between electrode 64B and adjacent electrodes 64A and 64C. Outer conductive pads 84 may also be exposed during step 406. The etch depth associated with the second etching step 406 may be controlled such that the etch stops at the interface between passivation layer 66' and metal electrodes 64. The exposed portions B of outer conductive pads 84 may be used as bonding regions where substrate 62 is bonded to MEMS structure 44.

The example of FIG. 10 in which signal-sensing electrodes 64A and 64C are exposed during the second etch step 406 (e.g., to form a semiconductor substrate of the type shown in FIG. 7) is merely illustrative. If desired, a thin film of dielectric material 66' may remain on electrodes 64A and 64C after the second etch step 406 (e.g., to form a semiconductor substrate of the type shown in FIG. 8). With this type of arrangement, the second etch step 406 may include removing dielectric material 66' in bonding regions B of outer conductive pads 84 to expose portions B of pads 84.

At step 408, semiconductor substrate 62 may be bonded to a corresponding MEMS structure such as MEMS structure 44 to form MEMS device 42. As shown in FIG. 10, a bonding member such as bonding member 70 may be used to bond MEMS structure 44 to semiconductor substrate 62. Bonding member 70 may, for example, be an aluminum-germanium eutectic bond that forms a hermetic seal around the MEMS structure while also forming an electrical connection between MEMS structure 44 and semiconductor substrate 62. As shown in FIG. 10, bonding member 70 is interposed between peripheral portion 44P of MEMS structure 44 and conductive pads 84 of semiconductor substrate 62. If desired, other bonding techniques may be used to mechanically and electrically bond semiconductor substrate 62 to MEMS structure 44 (e.g., surface bonding, metallic layer bonding, conductive adhesive bonding, etc.). The use of a eutectic bond is merely illustrative.

As shown in FIG. 10, some of the electrodes on semiconductor substrate 62 are exposed (e.g., are not covered by dielectric material 66 or 66'), while other electrodes on semiconductor substrate 62 are insulated by dielectric material 66'. For example, non-signal-sensing electrode 64B may be covered by dielectric material 66', while signal-sensing electrodes 64A and 64C may be exposed. Because dielectric material 66 insulates electrode 64B from electrode 64A, particles that are released from silicon MEMS member 46 in a drop event will not cause an electrical short between electrode 64A and electrode 64B. Similarly, the dielectric material between electrode 64B and electrode 64C may prevent electrical shorts between electrode 64B and electrode 64C.

If desired, a thin layer of dielectric material 66' may cover signal-sensing electrodes 64A and 64C in MEMS device 42 (e.g., as shown in FIG. 8). Signal-sensing electrodes 64A and 64C may still be used to gather signals that are produced by movement of suspended member 46 even when covered by a thin layer of dielectric material 66'.

The foregoing is merely illustrative of the principles of this invention and various modifications can be made by those skilled in the art without departing from the scope and spirit of the invention.

What is claimed is:

1. A microelectromechanical systems device, comprising:
    a first substrate having a cavity and a member that is anchored to the first substrate and suspended over the cavity;
    a second substrate having circuitry including first and second electrodes that gather signals produced by movement of the member; and
    a passivation layer that completely covers the first electrode, the second electrode, and a ground electrode that is between the first and second electrodes, wherein the passivation layer prevents electrical shorts between the member and each of the first, second, and ground electrodes.

2. The microelectromechanical systems device defined in claim 1 wherein the first substrate is bonded to the second substrate.

3. The microelectromechanical systems device defined in claim 1 wherein the passivation layer prevents electrical shorts between the first electrode and the ground electrode.

4. The microelectromechanical systems device defined in claim 1 wherein the second substrate comprises a complementary metal-oxide-semiconductor substrate.

5. The microelectromechanical systems device defined in claim 1 wherein the first substrate comprises a silicon substrate having trenches that surround the member and wherein the member is free to vibrate within the cavity.

6. The microelectromechanical systems device defined in claim 1 wherein the first substrate is bonded to the second substrate using an eutectic bond.

7. The microelectromechanical systems device defined in claim 1 wherein the passivation layer is interposed between the first electrode and the member and is interposed between the second electrode and the member.

8. The microelectromechanical systems device defined in claim 7 wherein the ground electrode is held at a higher potential than the first electrode and the second electrode.

9. The microelectromechanical systems device defined in claim 1 wherein the ground electrode and the member are held at a first voltage, and wherein the first and second electrodes are held at a second voltage that is less than the first voltage.

10. The microelectromechanical systems device defined in claim 1 wherein the first substrate forms a cap that covers the cavity and the member such that the cavity and the member are interposed between the cap and the second substrate.

11. A microelectromechanical systems device, comprising:
    a first substrate having a cavity and a member suspended over the cavity and free to move within the cavity;
    a second substrate having circuitry including first and second electrodes, wherein signals produced by movement of the member are capacitively coupled onto the first electrode, and wherein the second substrate has a surface on which the first and second electrodes are formed; and
    a dielectric film that covers the second electrode, wherein the dielectric film is interposed between the second electrode and the member and prevents electrical shorts between the second electrode and the member, wherein the dielectric film extends across the second substrate and contacts the first electrode without overlapping the first electrode along an axis perpendicular to the surface of the substrate.

12. The microelectromechanical systems device defined in claim 11 wherein the first electrode is a capacitive sensing electrode.

13. The microelectromechanical systems device defined in claim 11 wherein the first substrate is bonded to the second substrate.

14. The microelectromechanical systems device defined in claim 11 wherein the first substrate is a silicon substrate.

15. The microelectromechanical systems device defined in claim 11 wherein the second substrate is a complementary metal-oxide-semiconductor substrate.

16. The microelectromechanical systems device defined in claim 11 wherein the microelectromechanical systems device comprises an accelerometer.

* * * * *